United States Patent
Westerberg et al.

(10) Patent No.: US 12,464,849 B2
(45) Date of Patent: Nov. 4, 2025

(54) SOLAR CELL EMITTER REGION FABRICATION WITH DIFFERENTIATED P-TYPE AND N-TYPE ARCHITECTURES AND INCORPORATING A MULTI-PURPOSE PASSIVATION AND CONTACT LAYER

(71) Applicant: Maxeon Solar Pte. Ltd., Singapore (SG)

(72) Inventors: Staffan Westerberg, Sunnyvale, CA (US); Seung Bum Rim, Palo Alto, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 18/773,281

(22) Filed: Jul. 15, 2024

(65) Prior Publication Data
US 2024/0372016 A1 Nov. 7, 2024

Related U.S. Application Data

(60) Division of application No. 15/362,045, filed on Nov. 28, 2016, now Pat. No. 12,074,232, which is a (Continued)

(51) Int. Cl.
*H01L 31/00* (2006.01)
*H10F 10/14* (2025.01)
(Continued)

(52) U.S. Cl.
CPC ......... *H10F 77/311* (2025.01); *H10F 10/146* (2025.01); *H10F 71/103* (2025.01); (Continued)

(58) Field of Classification Search
CPC .. H10F 77/311; H10F 77/122; H10F 77/1223; H10F 77/1642; H10F 77/1662; (Continued)

(56) References Cited

U.S. PATENT DOCUMENTS

| 5,589,008 A | 12/1996 | Keppner |
| 6,043,426 A | 3/2000 | DePoy et al. |

(Continued)

FOREIGN PATENT DOCUMENTS

| TW | 201448257 | 12/2014 |
| TW | 201501336 | 1/2015 |

(Continued)

OTHER PUBLICATIONS

Office Action from Taiwan Patent Application No. 105108940 dated Sep. 27, 2019, 3 pgs.

(Continued)

*Primary Examiner* — Thanh Truc Trinh
(74) *Attorney, Agent, or Firm* — Schwabe, Williamson & Wyatt, P.C.

(57) ABSTRACT

Methods of fabricating solar cell emitter regions with differentiated P-type and N-type architectures and incorporating a multi-purpose passivation and contact layer, and resulting solar cells, are described. In an example, a solar cell includes a substrate having a light-receiving surface and a back surface. A P-type emitter region is disposed on the back surface of the substrate. An N-type emitter region is disposed in a trench formed in the back surface of the substrate. An N-type passivation layer is disposed on the N-type emitter region. A first conductive contact structure is electrically connected to the P-type emitter region. A second conductive contact structure is electrically connected to the N-type emitter region and is in direct contact with the N-type passivation layer.

15 Claims, 5 Drawing Sheets

Related U.S. Application Data continuation of application No. 14/671,781, filed on Mar. 27, 2015, now Pat. No. 9,525,083.

(51) Int. Cl.
   | | |
   |---|---|
   | *H10F 71/00* | (2025.01) |
   | *H10F 71/10* | (2025.01) |
   | *H10F 77/122* | (2025.01) |
   | *H10F 77/1223* | (2025.01) |
   | *H10F 77/164* | (2025.01) |
   | *H10F 77/166* | (2025.01) |
   | *H10F 77/20* | (2025.01) |
   | *H10F 77/30* | (2025.01) |
   | *H10F 77/70* | (2025.01) |

(52) U.S. Cl.
   CPC ....... *H10F 71/1221* (2025.01); *H10F 71/129* (2025.01); *H10F 77/122* (2025.01); *H10F 77/1223* (2025.01); *H10F 77/1642* (2025.01); *H10F 77/1662* (2025.01); *H10F 77/219* (2025.01); *H10F 77/315* (2025.01); *H10F 77/703* (2025.01); *Y02E 10/546* (2013.01); *Y02E 10/547* (2013.01); *Y02E 10/548* (2013.01); *Y02P 70/50* (2015.11)

(58) Field of Classification Search
   CPC .... H10F 77/219; H10F 77/703; H10F 10/146; H10F 71/103; H10F 71/1221; H10F 71/129; H10F 71/122; Y02E 10/546; Y02E 10/547; Y02E 10/548; Y02P 70/50
   See application file for complete search history.

(56) References Cited

U.S. PATENT DOCUMENTS

| | | | |
|---|---|---|---|
| 7,705,237 | B2 | 4/2010 | Swanson |
| 7,718,888 | B2 | 5/2010 | Cousins |
| 7,737,357 | B2 | 6/2010 | Cousins |
| 8,450,134 | B2 | 5/2013 | De Ceuster et al. |
| 8,815,631 | B2 | 8/2014 | Cousins |
| 9,252,301 | B2 | 2/2016 | Morigami et al. |
| 9,257,593 | B2 | 2/2016 | Hashiguchi et al. |
| 9,269,839 | B2 | 2/2016 | Lee et al. |
| 9,362,426 | B2 | 6/2016 | Goto et al. |
| 2004/0200520 | A1 | 10/2004 | Mulligan et al. |
| 2006/0130891 | A1 | 6/2006 | Carlson |
| 2008/0061293 | A1 | 3/2008 | Ribeyron et al. |
| 2008/0251117 | A1 | 10/2008 | Schubert et al. |
| 2009/0314341 | A1 | 12/2009 | Borden et al. |
| 2010/0154876 | A1 | 6/2010 | Camalleri et al. |
| 2010/0206369 | A1 | 8/2010 | Kim et al. |
| 2011/0000532 | A1 | 1/2011 | Niira et al. |
| 2011/0056545 | A1 | 3/2011 | Ji et al. |
| 2011/0277825 | A1 | 11/2011 | Fu et al. |
| 2012/0285518 | A1 | 11/2012 | De Souza et al. |
| 2013/0081679 | A1 | 4/2013 | Qu et al. |
| 2013/0133728 | A1 | 5/2013 | Wu et al. |
| 2013/0186456 | A1 | 7/2013 | Ide et al. |
| 2013/0240029 | A1 | 9/2013 | Smith |
| 2013/0247965 | A1 | 9/2013 | Swanson et al. |
| 2014/0020752 | A1 | 1/2014 | Arimoto et al. |
| 2014/0027875 | A1 | 1/2014 | Hasegawa et al. |
| 2015/0179838 | A1 | 6/2015 | Rim et al. |
| 2016/0056322 | A1 | 2/2016 | Yang et al. |
| 2016/0087122 | A1* | 3/2016 | Westerberg ........... H10F 77/147 |
| | | | 136/258 |
| 2016/0126368 | A1 | 5/2016 | Lee et al. |
| 2016/0155866 | A1 | 6/2016 | Ha et al. |
| 2016/0155877 | A1 | 6/2016 | Chung et al. |
| 2016/0155885 | A1 | 6/2016 | Shim et al. |
| 2016/0181461 | A1 | 6/2016 | Ueyama et al. |
| 2016/0197210 | A1 | 7/2016 | Hayashi et al. |
| 2016/0240704 | A1 | 8/2016 | Shim |
| 2016/0240705 | A1 | 8/2016 | Takahama |
| 2016/0268454 | A1 | 9/2016 | Gwon |
| 2016/0284885 | A1* | 9/2016 | Westerberg ........... H10F 77/703 |
| 2016/0284896 | A1* | 9/2016 | Westerberg ........... H10F 10/146 |
| 2019/0207041 | A1* | 7/2019 | Rim ........................ H10F 10/14 |

FOREIGN PATENT DOCUMENTS

| | | |
|---|---|---|
| TW | 201503384 | 1/2015 |
| WO | WO 2013/087458 | 6/2013 |
| WO | WO 2013/096500 | 6/2013 |

OTHER PUBLICATIONS

International Preliminary Report on Patentability from PCT/US2016/023315 mailed Oct. 12, 2017, 11 pgs.

International Search Report and Written Opinion from PCT/US2016/023315 mailed Jun. 23, 2016, 16 pgs.

Rim, et al., U.S. Appl. No. 14/136,751, filed Dec. 20, 2013, entitled Solar Cell Emitter Region Fabrication With Differentiated P-Type and N-Type Region Architectures, 36 pgs.

Westerberg, et al., U.S. Appl. No. 14/491,045, filed Sep. 19, 2014, entitled Solar Cell Emitter Region Fabrication With Differentiated P-Type and N-Type Architectures and Incorporating Dotted Diffusion, 37 pqs.

Final Office Action from U.S. Appl. No. 15/362,045 dated Dec. 19, 2023, 23 pgs.

Final Office Action from U.S. Appl. No. 15/362,045 dated Jan. 5, 2023, 26 pgs.

Final Office Action from U.S. Appl. No. 15/362,045 dated Jun. 24, 2021, 27 pgs.

Final Office Action from U.S. Appl. No. 15/362,045 dated Oct. 18, 2019, 18 pgs.

Final Office Action from U.S. Appl. No. 15/362,045 dated Sep. 9, 2020, 19 pgs.

Final Office Action from U.S. Appl. No. 15/362,045 dated Mar. 18, 2022, 32 pgs.

Non-Final Office Action from U.S. Appl. No. 15/362,045 dated Nov. 30, 2021, 27 pgs.

Non-Final Office Action from U.S. Appl. No. 15/362,045 dated Dec. 23, 2020, 18 pgs.

Non-Final Office Action from U.S. Appl. No. 15/362,045 dated Mar. 6, 2019, 28 pgs.

Non-Final Office Action from U.S. Appl. No. 15/362,045 dated Feb. 21, 2020, 18 pgs.

Non-Final Office Action from U.S. Appl. No. 15/362,045 dated Sep. 8, 2023, 26 pgs.

Non-Final Office Action from U.S. Appl. No. 15/362,045 dated Sep. 21, 2022, 27 pgs.

Non-Final Office Action from U.S. Appl. No. 15/362,045 dated Sep. 8, 2023, 25 pgs.

* cited by examiner

SOLAR CELL EMITTER REGION FABRICATION WITH DIFFERENTIATED P-TYPE AND N-TYPE ARCHITECTURES AND INCORPORATING A MULTI-PURPOSE PASSIVATION AND CONTACT LAYER

CROSS-REFERENCE TO RELATED APPLICATIONS

This application is a divisional of U.S. patent application Ser. No. 15/362,045, filed on Nov. 28, 2016, which is a continuation of U.S. patent application Ser. No. 14/671,781, filed on Mar. 27, 2015, now U.S. Pat. No. 9,525,083, issued on Dec. 20, 2016, the entire contents of which are hereby incorporated by reference herein.

TECHNICAL FIELD

Embodiments of the present disclosure are in the field of renewable energy and, in particular, methods of fabricating solar cell emitter regions with differentiated P-type and N-type architectures and incorporating a multi-purpose passivation and contact layer, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

BRIEF DESCRIPTION OF THE DRAWINGS

FIGS. 1-7 illustrate cross-sectional views of various stages in the fabrication of a solar cell, in accordance with an embodiment of the present disclosure, wherein:

FIG. 1 illustrates a cross-sectional view of a stage in solar cell fabrication involving forming a P-type silicon layer on a first thin dielectric layer formed on a back surface of a substrate, and forming an insulating layer on the P-type silicon layer;

FIG. 2 illustrates a cross-sectional view of the structure of FIG. 1 following patterning of the insulating layer and the P-type silicon layer to form P-type silicon regions having an insulating cap thereon;

FIG. 3 illustrates a cross-sectional view of the structure of FIG. 2 following texturing of the surfaces of the trenches to form texturized recesses or trenches having texturized surfaces within the substrate;

FIG. 4 illustrates a cross-sectional view of the structure of FIG. 3 following formation of second and third thin dielectric layers and an N-type silicon layer;

FIG. 5 illustrates a cross-sectional view of the structure of FIG. 4 following formation of an N-type amorphous silicon layer on the N-type silicon layer;

FIG. 6 illustrates a cross-sectional view of the structure of FIG. 5 following patterning of the N-type amorphous silicon layer and the N-type silicon layer to form isolated N-type emitter regions and to form contact openings in regions of the N-type amorphous silicon layer and the N-type silicon layer above the insulating cap of the P-type silicon regions; and FIG. 7 illustrates a cross-sectional view of the structure of FIG. 6 following formation of a plurality of conductive contacts.

DETAILED DESCRIPTION

Figure 1:
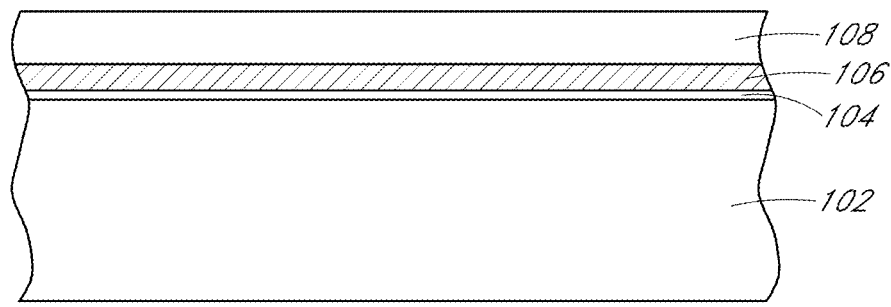

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Methods of fabricating solar cell emitter regions with differentiated P-type and N-type architectures and incorporating a multi-purpose passivation and contact layer, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are solar cells. In one embodiment, a solar cell includes a substrate having a light-receiving surface and a back surface. A P-type emitter region is disposed on the back surface of the substrate. An N-type emitter region is disposed in a trench formed in the back surface of the substrate. An N-type passivation layer is disposed on the N-type emitter region. A first conductive contact structure is electrically connected to the P-type emitter region. A second conductive contact structure is electrically connected to the N-type emitter region and is in direct contact with the N-type passivation layer.

In another embodiment, a solar cell includes a substrate having a light-receiving surface and a back surface. An N-type emitter region is disposed on the back surface of the substrate. A P-type emitter region is disposed in a trench formed in the back surface of the substrate. A P-type passivation layer is disposed on the P-type emitter region. A first conductive contact structure is electrically connected to the N-type emitter region. A second conductive contact structure is electrically connected to the P-type emitter region and is in direct contact with the P-type passivation layer.

In another embodiment, a back contact solar cell includes a substrate having a light-receiving surface and a back surface. A P-type polycrystalline silicon emitter region is disposed on a first thin dielectric layer disposed on the back surface of the substrate. An N-type polycrystalline silicon emitter region is disposed on a second thin dielectric layer disposed in a trench formed in the back surface of the substrate. A third thin dielectric layer is disposed laterally directly between the N-type and P-type polycrystalline silicon emitter regions. An N-type silicon layer is disposed on the N-type polycrystalline silicon emitter region. A first conductive contact structure is electrically connected to the P-type polycrystalline silicon emitter region. A second conductive contact structure is electrically connected to the N-type polycrystalline silicon emitter region and in direct contact with the N-type silicon layer.

Also disclosed herein are methods of fabricating solar cells. In one embodiment, a method of fabricating alternating N-type and P-type emitter regions of a solar cell involves forming a P-type silicon layer on a first thin dielectric layer formed on a back surface of a substrate. The method also involves forming an insulating layer on the P-type silicon layer. The method also involves patterning the insulating layer and the P-type silicon layer to form P-type silicon regions having an insulating cap thereon. The method also involves forming a second thin dielectric layer on exposed sides of the P-type silicon regions. The method also involves forming an N-type silicon layer on a third thin dielectric layer formed on the back surface of the substrate, and on the second thin dielectric layer and the insulating cap of the P-type silicon regions. The method also involves forming an N-type amorphous silicon layer on the N-type silicon layer. The method also involves patterning the N-type amorphous silicon layer and the N-type silicon layer to form isolated N-type emitter regions and to form contact openings in regions of the N-type amorphous silicon layer and the N-type silicon layer above the insulating cap of the P-type silicon regions. The method also involves patterning the insulating cap through the contact openings to expose portions of the P-type silicon regions. The method also involves forming conductive contacts to the P-type silicon regions and to the N-type emitter regions, the conductive contacts to the P-type silicon regions formed in the contact openings, and the conductive contacts to the N-type emitter regions formed in direct contact with the N-type amorphous silicon layer of the N-type emitter regions.

One or more embodiments described herein are directed to fabrication and use of an amorphous silicon (a-Si) layer for passivation of and to enable a simplified contact process for an underlying a polycrystalline silicon emitter region of a differentiated or hybrid architecture. In one particular embodiment, the amorphous silicon layer is included to provide hydrogen for passivation of the underlying a polycrystalline silicon emitter region. In one particular embodiment, effectively no contact process is required for an underlying emitter regions since suitable electrical contact is made to the amorphous silicon layer.

To provide context, one issue for differentiated or hybrid back contact solar cell architecture is the lack of a hydrogen source for N-type polycrystalline silicon emitters. A hydrogen source may be used to reduce an otherwise high saturation current density ($J_0$), which can be a particular issue for N-type emitter regions. The inclusion of silicon nitride (SiN)

or other dielectrics which can provide hydrogen may not be the best approach since such dielectric layers require additional contact process consideration for forming conductive contacts to an underlying emitter region.

Addressing one or more of the above issues, in an embodiment, a layer of N-type a-Si is deposited on an N-type polycrystalline silicon emitter region. The N-type a-Si layer is included to provide hydrogen to the underlying N-type emitter region. The N-type a-Si layer is also included for maintaining direct metal contact without having to implement a contact opening process. Accordingly, the N-type a-Si may be incorporated without having to modify a typical hybrid process flow metallization process. In one embodiment, the N-type a-Si protects the underlying N-type emitter region during contact formation, e.g., by inhibiting a reaction between an aluminum layer and the underlying N-type emitter region.

In an exemplary process flow, FIGS. 1-7 illustrate cross-sectional views of various stages in the fabrication of a solar cell, in accordance with an embodiment of the present disclosure. FIG. 8 is a flowchart 800 listing operations in a method of fabricating a solar cell as corresponding to FIGS. 1-7, in accordance with an embodiment of the present disclosure.

Referring to FIG. 1 and corresponding operation 802 of flowchart 800, a method of fabricating alternating N-type and P-type emitter regions of a solar cell involves forming a P-type silicon layer 106 on a first thin dielectric layer 104 formed on a back surface of a substrate 102.

In an embodiment, the substrate 102 is a monocrystalline silicon substrate, such as a bulk single crystalline N-type doped silicon substrate. It is to be appreciated, however, that substrate 102 may be a layer, such as a multi-crystalline silicon layer, disposed on a global solar cell substrate. In an embodiment, the first thin dielectric layer 104 is a thin oxide layer such as a tunnel dielectric silicon oxide layer having a thickness of approximately 2 nanometers or less.

In an embodiment, the P-type silicon layer 106 is a P-type polycrystalline silicon layer that is doped either through in situ doping, post deposition implanting, or a combination thereof. In another embodiment the P-type silicon layer 106 is first formed as an amorphous silicon layer such as a hydrogenated silicon layer represented by a-Si: H which is implanted with dopants subsequent to deposition of the amorphous silicon layer. In one such embodiment, the P-type silicon layer 106 is subsequently annealed (at least at some subsequent stage of the process flow) to ultimately form a P-type polycrystalline silicon layer. In an embodiment, for either a polycrystalline silicon layer or an amorphous silicon layer, if post deposition implantation is performed, the implanting is performed by using ion beam implantation or plasma immersion implantation. In one such embodiment, a shadow mask is used for the implanting. In a specific embodiment, the P-type conductivity is achieved using boron impurity atoms.

Referring again to FIG. 1 and now to corresponding operation 804 of flowchart 800, an insulating layer 108 is formed on the P-type silicon layer 106. In an embodiment the insulating layer 108 includes silicon dioxide.

Figure 2:
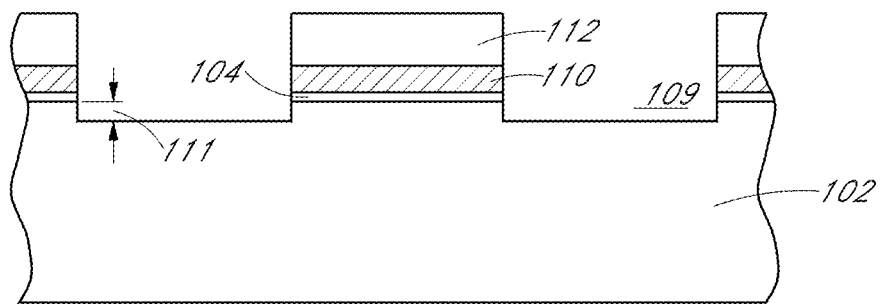

Referring to FIG. 2 and corresponding operation 806 of flowchart 800, the insulating layer 108 and the P-type silicon layer 106 are patterned to form first P-type silicon regions 110 each having an insulating cap 112 thereon. In an embodiment, a laser ablation process (e.g., direct write) is used to pattern the insulating layer 108 and the P-type silicon layer 106. Where applicable, in one embodiment, the first thin dielectric layer 104 is also patterned in the process, as is depicted in FIG. 2.

In an embodiment, the insulating layer 108 and the P-type silicon layer 106 are patterned using a laser ablation process. In one such embodiment, the laser ablation process exposes a plurality of regions 109 of an N-type monocrystalline silicon substrate 102. Each of the plurality of regions 109 of the N-type monocrystalline silicon substrate 102 can be viewed as a plurality of non-continuous trenches formed in the N-type monocrystalline silicon substrate 102. The option that the trenches 109 have a depth or thickness 111 into the substrate 102 is depicted in FIG. 2. In one such embodiment, each of the plurality of non-continuous trenches 109 is formed to a non-zero depth 111 less than approximately 10 microns into the substrate 102 upon laser ablation. In an embodiment, using the laser ablation process provides each of the plurality of non-continuous trenches with a width (e.g., maximum diameter) approximately in the range of 30-60 microns. In an embodiment, the laser ablation process involves using a laser beam having an approximately Gaussian profile or having an approximately flat-top profile.

Figure 3:
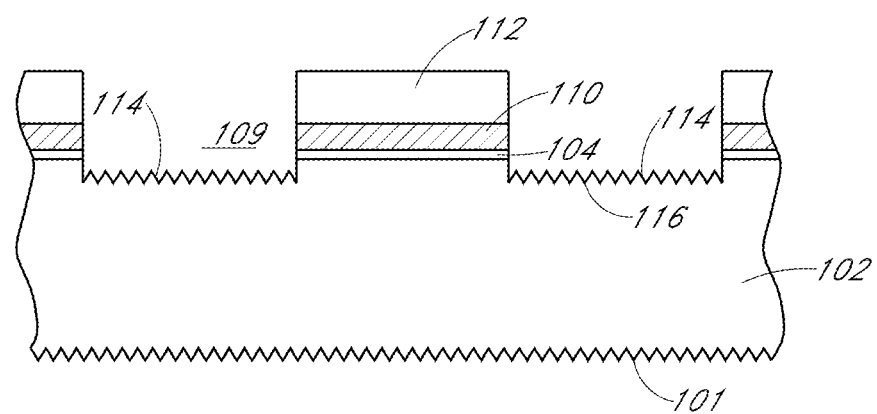

Referring to FIG. 3, optionally, the surfaces of the trenches 109 may be texturized to form texturized recesses or trenches 114 having texturized surfaces 116 within the substrate 102. In a same or similar process, a light receiving surface 101 of the substrate 102 may also be texturized, as is depicted in FIG. 3. In an embodiment, a hydroxide-based wet etchant is used to form at least a portion of the recesses 114 and/or to texturize exposed portions of the substrate 102. A texturized surface may be one which has a regular or an irregular shaped surface for scattering incoming light, decreasing the amount of light reflected off of the light-receiving and/or exposed surfaces of the solar cell. It is to be appreciated, however, that the texturizing of the back surface and even the recess formation may be omitted from the process flow. It is also to be appreciated that, if applied, the texturizing may increase the depth of the trenches 109 from the originally formed depth.

Figure 4:
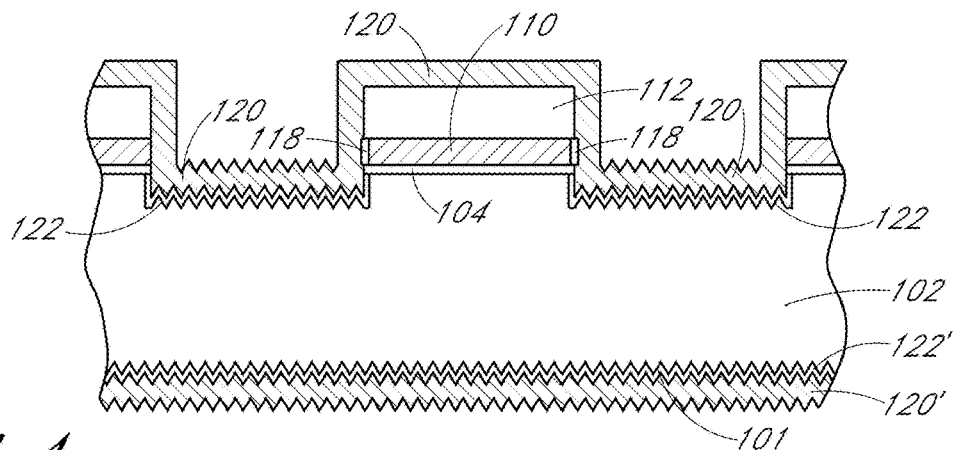

Referring to FIG. 4 and corresponding operation 808 of flowchart 800, a second thin dielectric layer 118 is formed on exposed sides of the P-type silicon regions 118. In an embodiment, the second thin dielectric layer 118 is formed in an oxidation process and is a thin oxide layer such as a tunnel dielectric silicon oxide layer having a thickness of approximately 2 nanometers or less. In another embodiment, the second thin dielectric layer 118 is formed in a deposition process and is a thin silicon nitride layer or silicon oxynitride layer.

Referring again to FIG. 4 and now to corresponding operation 810 of flowchart 700, an N-type silicon layer 120 is formed on a third thin dielectric layer 122 formed on the exposed portions of the back surface of the substrate 102 (e.g., formed in each of the plurality of non-continuous trenches 109 of each of the plurality of regions of the N-type monocrystalline silicon substrate 102). The N-type silicon layer 120 is further formed on the second thin dielectric layer 118 and on the insulating cap 112 of the P-type silicon regions 110. The N-type silicon layer 120 covers (from a top-down perspective) the trench regions 109.

Referring again to FIG. 4, corresponding thin dielectric layer 122' and N-type silicon layer 120' may also be formed on the light-receiving surface 101 of the substrate 102, in same or similar process operations. Additionally, although not depicted, an anti-reflective coating (ARC) layer may be formed on the corresponding N-type silicon layer 120'.

In an embodiment, the third thin dielectric layer 122 is formed in an oxidation process and is a thin oxide layer such as a tunnel dielectric silicon oxide layer having a thickness of approximately 2 nanometers or less. In an embodiment, the N-type silicon layer 120 is a polycrystalline silicon layer that is doped either through in situ doping, post deposition implanting, or a combination thereof. In another embodiment the N-type silicon layer 120 is an amorphous silicon layer such as a hydrogenated silicon layer represented by a-Si: H which is implanted with dopants subsequent to deposition of the amorphous silicon layer. In one such embodiment, the N-type silicon layer 120 is subsequently annealed (at least at some subsequent stage of the process flow) to ultimately form an N-type polycrystalline silicon layer. In an embodiment, for either a polycrystalline silicon layer or an amorphous silicon layer, if post deposition implantation is performed, the implanting is performed by using ion beam implantation or plasma immersion implantation. In one such embodiment, a shadow mask is used for the implanting. In a specific embodiment, the N-type conductivity is achieved using phosphorus atoms or arsenic impurity atoms.

Figure 5:
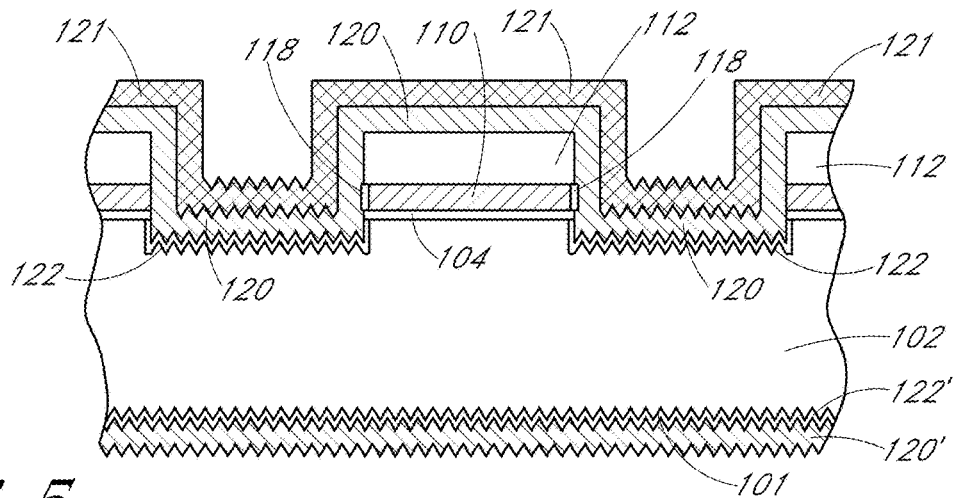

Referring to FIG. 5 and corresponding operation 812 of flowchart 800, an N-type amorphous silicon layer 121 is formed on the N-type silicon layer 120. In an embodiment, the N-type amorphous silicon layer 121 is formed by depositing N-type amorphous silicon using plasma-enhanced chemical vapor deposition (PECVD) at a temperature below approximately 400 degrees Celsius. In one such embodiment, the N-type amorphous silicon layer 121 is formed to have a total hydrogen concentration approximately in the range of 5-20% of total film composition, and a total phosphorous dopant concentration approximately in the range of 1E19-5E20 atoms/cm$^3$. In one embodiment, the N-type amorphous silicon layer 121 is formed to a thickness approximately in the range of 5-50 nanometers. In another embodiment, however, the N-type amorphous silicon layer 121 is formed to a thickness of greater than approximately 50 nanometers.

Figure 6:
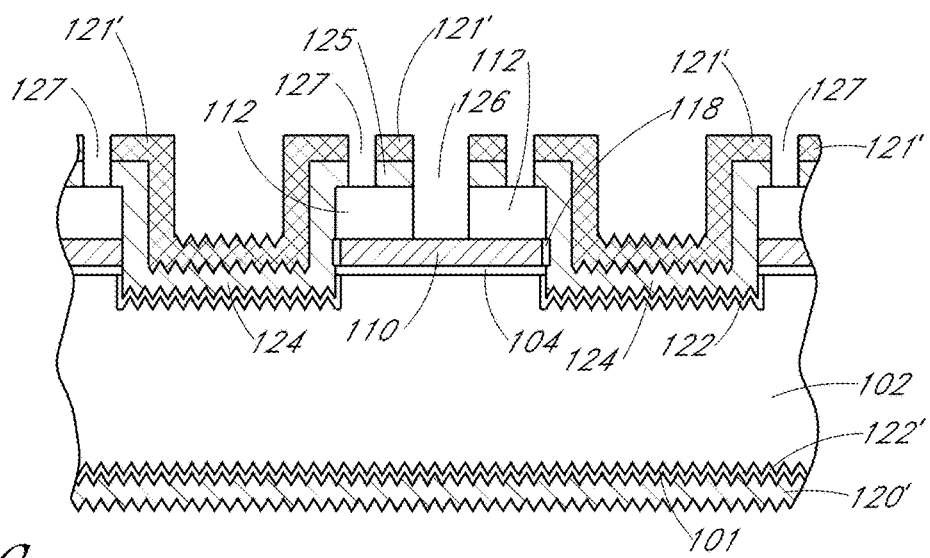

Referring to FIG. 6 and corresponding operation 814 of flowchart 800, the N-type amorphous silicon layer 121 and the N-type silicon layer 120 are patterned to form to form patterned N-type amorphous silicon layer 121' and isolated N-type emitter regions 124. The patterning is used to form contact openings 126 and isolation openings 127 in regions of the patterned N-type amorphous silicon layer 121' and the N-type silicon layer (formerly layer 120) above the insulating cap 112 of the P-type silicon regions 110. In an embodiment, each isolated N-type silicon region 124 is electrically coupled to a corresponding one (or more) of the plurality of regions 109 of the N-type monocrystalline silicon substrate 102. In an embodiment, discrete regions of N-type silicon 125 may remain as an artifact of the patterning process. In an embodiment, a laser ablation process is used to pattern the N-type amorphous silicon layer 121 and the N-type silicon layer 120.

Referring again to FIG. 6 and now to corresponding operation 816 of flowchart 800, the insulating cap 112 is patterned through the contact openings 126 to expose portions of the P-type silicon regions 110. In an embodiment, the insulating cap 112 is patterned using a laser ablation process. For example, in one embodiment, a first laser pass is used to pattern the N-type amorphous silicon layer 121 and the N-type silicon layer 120, including initiating formation of the contact opening 126. A second laser pass in the same location as the initiated contact opening 126 is the used to pattern the insulating cap 112, providing contact opening 126.

Figure 7:
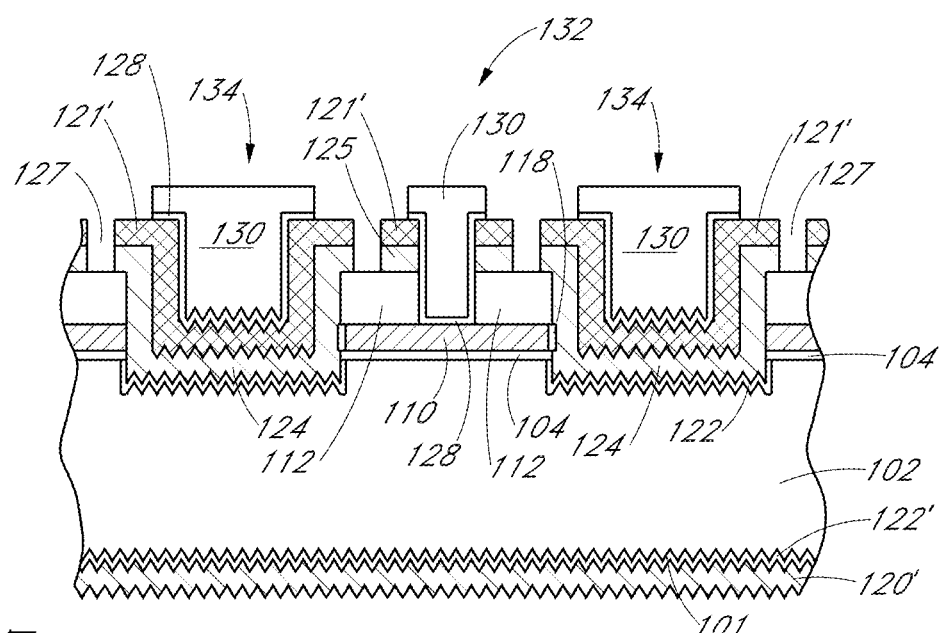
Figure 8:
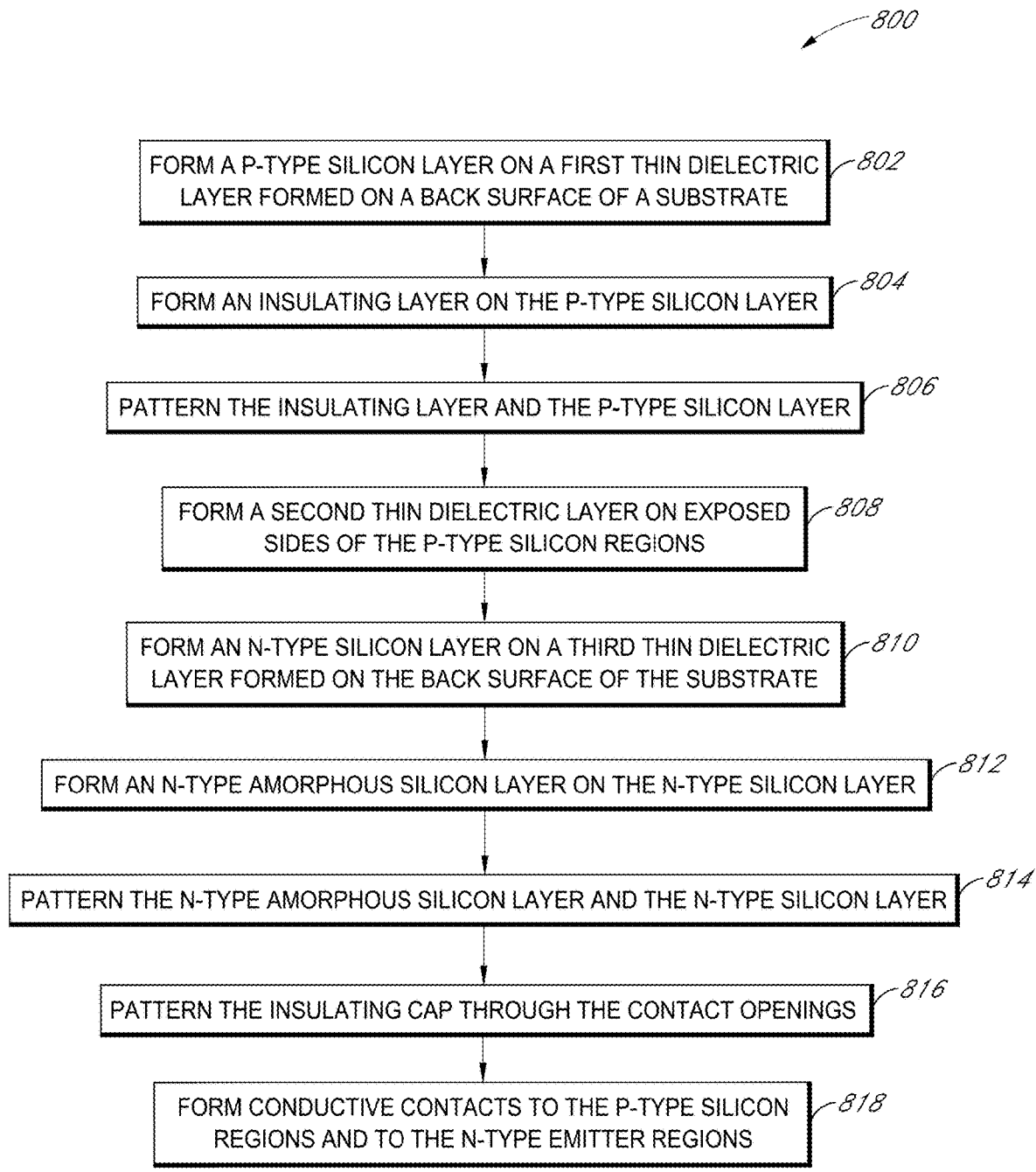
FIG. 8 is a flowchart listing operations in a method of fabricating a solar cell as corresponding to FIGS. 1-7, in accordance with an embodiment of the present disclosure.

Referring to FIG. 7 and corresponding operation 818 of flowchart 800, a plurality of conductive contacts is formed, each conductive contact electrically connected to one of the P-type silicon regions or one of the isolated N-type silicon regions. In particular, conductive contacts 132 are formed in the contact openings 126 for the P-type silicon regions 110. In one embodiment, the conductive contacts 130 are in directed contact with the corresponding P-type silicon regions 110. Conductive contacts 134 are formed on portions of the patterned N-type amorphous silicon layer 121' for the N-type emitter regions (isolated N-type emitter regions 124 of the N-type silicon layer 120). In one embodiment, the conductive contacts 134 are formed in direct contact with the N-type amorphous silicon layer 121' without exposing the surface of the isolated N-type emitter regions 124.

In an exemplary embodiment, a metal seed layer 128 is formed on the exposed portions of the P-type silicon regions 110 and on the isolated N-type silicon regions 124. A metal layer 130 is then plated on the metal seed layer to form conductive contacts 132 and 134, respectively, for the P-type silicon regions 110 and the isolated N-type silicon regions 124. In an embodiment, the metal seed layer 128 is an aluminum-based metal seed layer, and the metal layer 130 is a copper layer. In an embodiment, a mask is first formed to expose only the exposed portions of the P-type silicon regions 110 and the isolated N-type silicon regions 124 in order to direct the metal seed layer 128 formation to restricted locations.

Thus, one or more embodiments described herein are directed to forming P+ and N+ polysilicon emitter regions for a solar cell where the respective structures of the P+ and N+ polysilicon emitter regions are different from one another. Such an approach can be implemented to simplify a solar cell fabrication process. Furthermore, the resulting structure may provide a lower breakdown voltage and lower power losses associated as compared with other solar cell architectures.

With reference again to FIG. 7, in an embodiment, a finalized solar cell includes a substrate 102 having a light-receiving surface 101 and a corresponding back surface. A P-type polycrystalline silicon emitter region 110 is disposed on a first thin dielectric layer 104 disposed on the back surface of the substrate 102. An N-type polycrystalline silicon emitter region 124 is disposed on a second thin dielectric layer 122 disposed in a trench (shown as recess in cross-sectional view of FIG. 7) in the back surface of the substrate 102. An N-type silicon layer 121' is disposed on the N-type polycrystalline silicon emitter region 124.

In an embodiment, the N-type silicon layer 121' is included as a multi-purpose passivation and contact layer. In an embodiment, the substrate 102 is an N-type monocrystalline silicon substrate. In an embodiment, the solar cell is a back contact solar cell, as is depicted in FIG. 7. In an embodiment, the N-type silicon layer 121' is further disposed over, but not in contact with, the P-type polycrystalline silicon emitter region 110, as is also depicted in FIG. 7.

In an embodiment, the N-type silicon layer 121' is an N-type amorphous silicon layer. In one such embodiment, a total composition of the N-type amorphous silicon layer has a total hydrogen concentration approximately in the range of 5-20% of total film composition. In another embodiment, a total composition of the N-type amorphous silicon layer has a total phosphorous dopant concentration approximately in the range of 1E19-5E20 atoms/cm$^3$.

In an embodiment, the N-type silicon layer 121' has a thickness approximately in the range of 5-50 nanometers. In an embodiment, the N-type polycrystalline silicon emitter region 124 has a thickness of approximately 30 nanometers, and the N-type silicon layer 121' has a thickness of approximately 20 nanometers. In one embodiment, the N-type polycrystalline silicon emitter region 124 is formed in a trench having a texturized surface, as is depicted in FIG. 7. In another embodiment, the N-type amorphous silicon layer 121' has a thickness of greater than approximately 50 nanometers.

Referring again to FIG. 7, in an embodiment, the solar cell further includes a third thin dielectric layer 118 disposed laterally directly between the first 110 and second 124 polycrystalline silicon emitter regions. In an embodiment, the solar cell further includes a first conductive contact structure 132 electrically connected to the P-type polycrystalline silicon emitter region 110. A second conductive contact structure 134 electrically connected to the N-type polycrystalline silicon emitter region 124. The second conductive contact structure 134 is in direct contact with the N-type silicon layer 121'.

In an embodiment, the solar cell further includes an insulator layer 112 disposed on the P-type polycrystalline silicon emitter region 110, as is depicted in FIG. 7. The first conductive contact structure 132 is disposed through the insulator layer 112. In one such embodiment, a portion of the N-type polycrystalline silicon emitter region 124 overlaps the insulator layer 112 but is separated from the first conductive contact structure 132, as is depicted in FIG. 7. In a further embodiment, an N-type polycrystalline silicon region 125 (e.g., as an isolated portion from the N-type polycrystalline silicon emitter region 124) is disposed on the insulator layer 112. A portion of the N-type silicon layer 121' is disposed on the portion of the N-type polycrystalline silicon emitter region 124 that overlaps the insulator layer 112 and on the N-type polycrystalline silicon region 125. The first conductive contact structure 132 is disposed through the N-type silicon layer 121', through the N-type polycrystalline silicon region 125 of the second conductivity type, and through the insulator layer 112, as is depicted in FIG. 7.

Referring again to FIG. 7, the solar cell further includes a fourth thin dielectric layer 122' disposed on the light-receiving surface 101 of the substrate 102. A polycrystalline silicon layer 120' is disposed on the fourth thin dielectric layer 122', which may be an N-type polycrystalline silicon layer 120'. Although, not depicted, an anti-reflective coating (ARC) layer may be disposed on the polycrystalline silicon layer 102'. In a particular embodiment, the substrate 102 is an N-type monocrystalline silicon substrate, and all of the first, second and third (and, if present, fourth) thin dielectric layers include silicon dioxide.

Although certain materials are described specifically with reference to above described embodiments, some materials may be readily substituted with others with other such embodiments remaining within the spirit and scope of embodiments of the present disclosure. For example, in an embodiment, a different material substrate, such as a group III-V material substrate, can be used instead of a silicon substrate. Additionally, although reference is made significantly to back contact solar cell arrangements, it is to be appreciated that approaches described herein may have application to front contact solar cells as well. In other embodiments, the above described approaches can be applicable to manufacturing of other than solar cells. For example, manufacturing of light emitting diode (LEDs) may benefit from approaches described herein.

Figure 9:
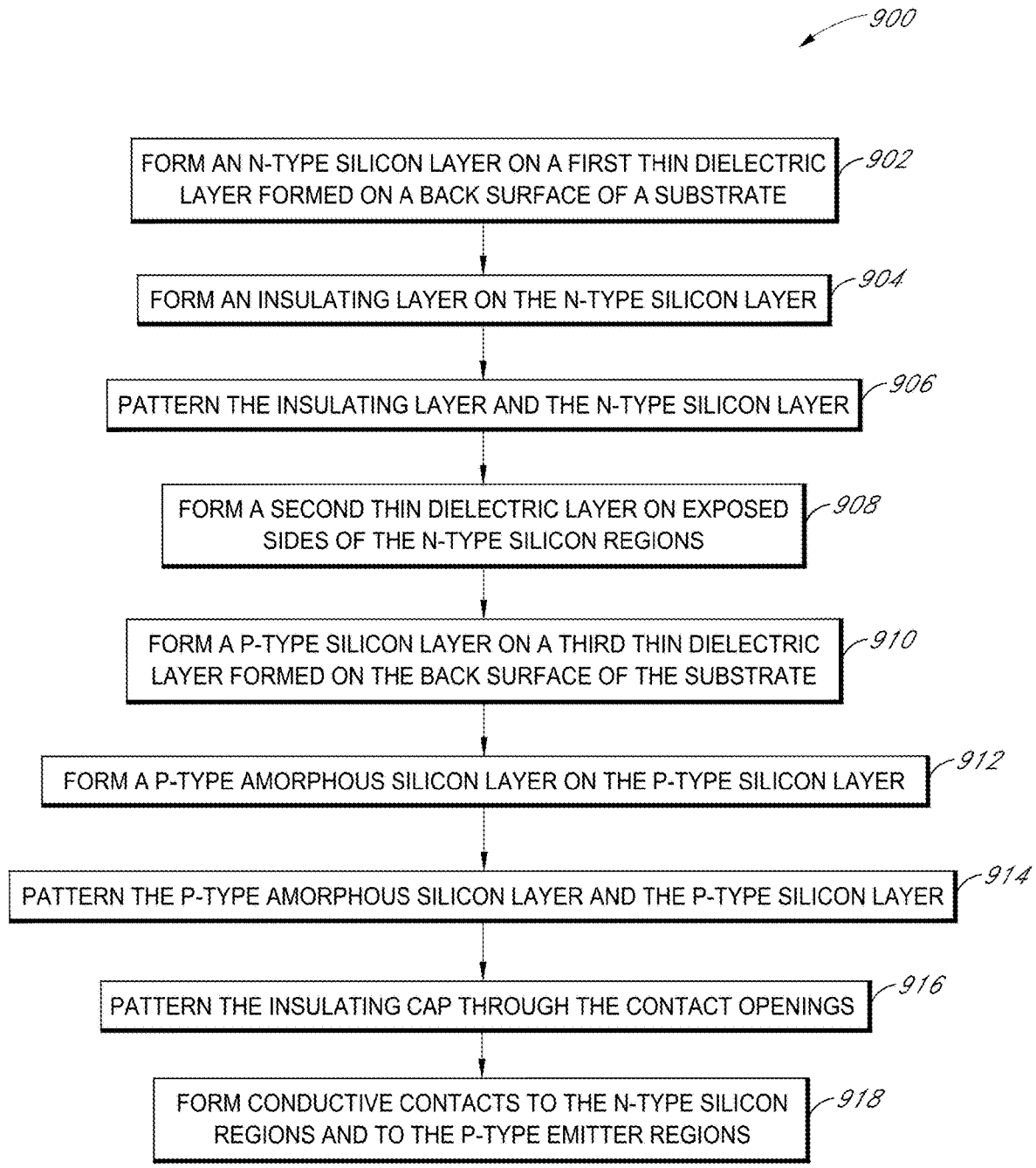
FIG. 9 is a flowchart listing operations in another method of fabricating a solar cell, in accordance with an embodiment of the present disclosure.

Furthermore, it is to be appreciated that, where N+ and P+ type doping is described specifically, other embodiments contemplated include the opposite conductivity type, e.g., P+ and N+ type doping, respectively. As such, in an embodiment, it possible to fabricate an architecture having a P-type passivation layer by processing a P-type emitter subsequent to processing an N-type emitter. Such an embodiment may be applicable when a P-type silicon substrate is used. As an example, FIG. 9 is a flowchart 900 listing operations in another method of fabricating a solar cell, in accordance with an embodiment of the present disclosure.

Referring to operation 902 of flowchart 900, a method of fabricating alternating N-type and P-type emitter regions of a solar cell involves forming an N-type silicon layer on a first thin dielectric layer formed on a back surface of a substrate. Referring to operation 904 of flowchart 900, an insulating layer is formed on the N-type silicon layer. Referring to operation 906 of flowchart 900, the insulating layer and the N-type silicon layer are patterned to form first N-type silicon regions each having an insulating cap thereon. Referring to operation 908 of flowchart 900, a second thin dielectric layer is formed on exposed sides of the N-type silicon regions. Referring to corresponding operation 910 of flowchart 900, a P-type silicon layer is formed on a third thin dielectric layer formed on the exposed portions of the back surface of the substrate. Referring to operation 912 of flowchart 900, a P-type amorphous silicon layer is formed on the P-type silicon layer. Referring to operation 914 of flowchart 900, the P-type amorphous silicon layer and the P-type silicon layer are patterned to form a patterned P-type amorphous silicon layer and isolated P-type emitter regions. Referring to operation 916 of flowchart 900, the insulating cap is patterned through the contact openings to expose portions of the N-type silicon regions. Referring to operation 918 of flowchart 900, a plurality of conductive contacts is formed, each conductive contact electrically connected to one of the N-type silicon regions or one of the isolated P-type silicon regions.

Thus, methods of fabricating solar cell emitter regions with differentiated P-type and N-type architectures and incorporating a multi-purpose passivation and contact layer, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating alternating N-type and P-type emitter regions of a solar cell, the method comprising:
    forming an N-type silicon layer on a first thin dielectric layer formed on a back surface of a substrate;
    forming an insulating layer on the N-type silicon layer;
    patterning the insulating layer and the N-type silicon layer to form N-type silicon regions having an insulating cap thereon;
    forming a second thin dielectric layer on exposed sides of the N-type silicon regions;
    forming a P-type silicon layer on a third thin dielectric layer formed on the back surface of the substrate, and on the second thin dielectric layer and the insulating cap of the N-type silicon regions;
    forming a P-type amorphous silicon layer on the P-type silicon layer;
patterning the P-type amorphous silicon layer and the P-type silicon layer to form isolated P-type emitter regions and to form contact openings in regions of the P-type amorphous silicon layer and the P-type silicon layer above the insulating cap of the N-type silicon regions;
patterning the insulating cap through the contact openings to expose portions of the N-type silicon regions; and
    forming conductive contacts to the N-type silicon regions and to the P-type emitter regions, the conductive contacts to the N-type silicon regions formed in the contact openings, and the conductive contacts to the P-type emitter regions formed in direct contact with the P-type amorphous silicon layer of the P-type emitter regions.

2. The method of claim 1, wherein forming the P-type amorphous silicon layer comprises depositing P-type amorphous silicon by plasma-enhanced chemical vapor deposition (PECVD) at a temperature below approximately 400 degrees Celsius.

3. The method of claim 1, wherein forming the P-type amorphous silicon layer comprises forming a P-type amorphous silicon layer having a total hydrogen concentration approximately in the range of 5-20% of total film composition, and having a total phosphorous dopant concentration approximately in the range of 1E19-5E20 atoms/cm3, and to a thickness approximately in the range of 5-50 nanometers.

4. A method of fabricating a solar cell, the method comprising:
    providing a semiconductor substrate having a light-receiving surface and a back surface, the back surface below the light-receiving surface;
    forming an N-type emitter region on the back surface of the semiconductor substrate, wherein the N-type emitter region is a planar layer;
    forming a P-type emitter region on the back surface of the semiconductor substrate, the P-type emitter region comprising polycrystalline silicon having hydrogen therein, and the P-type emitter region electrically insulated and physically isolated from the N-type emitter region by a single dielectric material, the single dielectric material in direct physical contact with the P-type emitter region and with the N-type emitter region, and the single dielectric material confined to sidewalls of the N-type emitter region, wherein the P-type emitter region is a non-planar layer, and wherein the P-type emitter region has an uppermost surface above an uppermost surface of the N-type emitter region, and the P-type emitter region has a bottommost surface below a bottommost surface of the N-type emitter region;
    forming a passivation layer on the P-type emitter region but not on the N-type emitter region, the passivation layer comprising amorphous silicon having hydrogen therein, the passivation layer covering an entirety of a side of the P-type emitter region opposite the semiconductor substrate;
    forming a first conductive contact structure electrically connected to and in direct contact with the N-type emitter region; and
    forming a second conductive contact structure electrically connected to the P-type emitter region and in direct contact with the passivation layer, wherein the second conductive contact structure has an uppermost surface below the uppermost surface of the N-type emitter region, wherein the second conductive contact is physically separated from an entirety of the P-type emitter region by the passivation layer.

5. The method of claim 4, wherein a total composition of the amorphous silicon has a total hydrogen concentration approximately in the range of 5-20% of total film composition.

6. The method of claim 4, wherein the passivation layer has a thickness approximately in the range of 5-50 nanometers.

7. A method of fabricating a back contact solar cell, the method comprising:
    providing a semiconductor substrate having a light-receiving surface and a back surface, the back surface below the light-receiving surface;
    forming an N-type polycrystalline silicon emitter region on a first thin dielectric layer on the back surface of the semiconductor substrate, wherein the N-type polycrystalline silicon emitter region is a planar layer;
    forming a P-type polycrystalline silicon emitter region on a second thin dielectric layer in a trench formed in the back surface of the semiconductor substrate, the P-type polycrystalline silicon emitter region having hydrogen therein, and the P-type polycrystalline silicon emitter region electrically insulated and physically isolated from the N-type polycrystalline silicon emitter region by a single third thin dielectric layer laterally directly between and in physical contact with both the N-type and the P-type polycrystalline silicon emitter regions, and the single third thin dielectric layer confined to sidewalls of the N-type polycrystalline silicon emitter region, wherein the P-type polycrystalline silicon emitter region is a non-planar layer, and wherein the P-type polycrystalline silicon emitter region has an uppermost surface above an uppermost surface of the N-type polycrystalline silicon emitter region, and the P-type emitter polycrystalline silicon region has a bottommost surface below a bottommost surface of the N-type polycrystalline silicon emitter region;
    forming a P-type silicon layer on the P-type polycrystalline silicon emitter region but not on the N-type polycrystalline silicon emitter region, the P-type silicon layer comprising amorphous silicon having hydrogen therein, the P-type silicon layer covering an entirety of a side of the P-type polycrystalline silicon emitter region opposite the semiconductor substrate;
    forming a first conductive contact structure electrically connected to and in direct contact with the N-type polycrystalline silicon emitter region; and
    forming a second conductive contact structure electrically connected to the P-type polycrystalline silicon emitter region and in direct contact with the P-type silicon layer, wherein the second conductive contact structure has an uppermost surface below the uppermost surface of the N-type polycrystalline silicon emitter region, wherein the second conductive contact is physically separated from an entirety of the P-type polycrystalline silicon emitter region by the P-type silicon layer.

8. The method of claim 7, wherein the P-type silicon layer is further over, but not in contact with, the N-type polycrystalline silicon emitter region.

9. The method of claim 7, wherein a total composition of the amorphous silicon has a total hydrogen concentration approximately in the range of 5-20% of total film composition.

10. The method of claim 7, wherein the P-type silicon layer has a thickness approximately in the range of 5-50 nanometers.

11. The method of claim 10, wherein the P-type polycrystalline silicon emitter region has a thickness of approximately 30 nanometers, and the P-type silicon layer has a thickness of approximately 20 nanometers.

12. The method of claim 7, further comprising:
forming an insulator layer on the N-type polycrystalline silicon emitter region, wherein the first conductive contact structure is through the insulator layer, and wherein a portion of the P-type polycrystalline silicon emitter region and a portion of the P-type silicon layer overlap the insulator layer.

13. The method of claim 7, wherein the trench has a texturized surface.

14. The method of claim 7, further comprising:
forming a fourth thin dielectric layer on the light-receiving surface of the semiconductor substrate;
forming a polycrystalline silicon layer on the fourth thin dielectric layer; and
forming an anti-reflective coating (ARC) layer on the polycrystalline silicon layer.

15. The method of claim 7, wherein the semiconductor substrate is a P-type monocrystalline silicon substrate, and wherein all of the first, second and third thin dielectric layers comprise silicon dioxide.

* * * * *